(12) United States Patent
Trask (10) Patent No.: US 6,242,964 B1
(45) Date of Patent: Jun. 5, 2001

(54) LOW-DISTORTION LOSSLESS FEEDBACK DOUBLE-BALANCED ACTIVE MIXERS USING LINEARITY AUGMENTATION

(76) Inventor: Christopher Trask, 1863 E. Palmcroft Dr., Tempe, AZ (US) 85282-2858

( * ) Notice: Subject to any disclaimer, the term of this patent is extended or adjusted under 35 U.S.C. 154(b) by 0 days.

(21) Appl. No.: 09/440,440

(22) Filed: Nov. 15, 1999

(51) Int. Cl.[7] .................................. G06F 7/44; G06G 7/16
(52) U.S. Cl. ........................ 327/359; 455/326; 455/333
(58) Field of Search .................................. 327/355, 356, 327/357, 358, 359; 455/326, 333

(56) References Cited

U.S. PATENT DOCUMENTS

| | | | |
|---|---|---|---|
| 2,337,965 | 12/1943 | Bode | 333/32 |
| 3,891,934 | 6/1975 | Norton et al. | 330/296 |
| 5,551,074 | * 8/1996 | Vice | 455/326 |

OTHER PUBLICATIONS

Norton, David E., "High Dynamic Range Transistor Amplifiers Using Lossless Feedback," Microwave Journal, May 1976, pp. 53–57.

Norton, David E., "High Dynamic Range Transistor Amplifiers Using Lossless Feedback," Proceedings of the 1975 IEEE Int'l Symposium on Circuits and Systems, pp. 438–440.

Sartori, Eugene F., "Hybrid Transformers," IEEE Transactions on Parts, Materials, and Packaging, vol. 4 No. 3, Sep. 1968, pp. 59–66.

Trask, C., "A Linearized Active Mixer," Proceedings RF Design 98, San Jose, CA, Oct. 1998, pp. 14–23.

Trask, C., "Disturtion Improvement of Lossless Feedback Amplifiers Using Augmentation," Proceedings of the 1999 Midwest Symposium on Circuits and Systems, Las Cruces, NM, Aug. 1999.

Trask, C., "Feedback Technique Improves Active Mixer Performance," RF Design, Sep. 1997, pp. 46–52.

* cited by examiner

*Primary Examiner*—Terry D. Cunningham
*Assistant Examiner*—Quan Tra (57) ABSTRACT

A low-noise, linearized double-balanced active mixer circuit is described, including a first input for a local oscillator (LO), a second input for an intermediate frequency (IF) signal, and an output for a resulting product radio frequency (RF) signal. The mixer circuit also includes a feedback transformer circuit for the purpose of improving the intermodulation (IM) performance. The lossless nature of the feedback topology gives the active mixer a lower noise figure (NF) characteristic than is realizable with conventional methods. The mixer circuit further includes an augmentation circuit for correcting the non-linear input resistance of the common-base transistor amplifier. According to a further embodiment, the augmentation circuit includes a common-emitter transistor amplifier circuit. According to a further embodiment the augmentation circuit includes a positive-feedback transistor amplifier circuit. According to a further embodiment the augmentation circuit includes a two-winding transformer.

6 Claims, 9 Drawing Sheets

LOW-DISTORTION LOSSLESS FEEDBACK DOUBLE-BALANCED ACTIVE MIXERS USING LINEARITY AUGMENTATION

This application is related to a pending application filed on Aug. 7, 1998 entitled "Active Double-Balanced Mixer with Embedded Linearization Amplifiers", application Ser. No. 9/130,740, by the same inventor the contents of which are incorporated herein by reference.

This application is related to a pending application filed Jun. 23, 1999 entitled "Common-Base Transistor Amplifiers with Linearity Augmentation", application Ser. No. 9/338,850, by the same inventor the contents of which are incorporated herein by reference.

This application is related to a pending application filed on Jun. 30, 1999 entitled "Lossless Feedback Transistor Amplifiers with Linearity Augmentation", application Ser. No. 9/340,495, by the same inventor the contents of which are incorporated herein by reference.

This application is related to a pending application filed on Jul. 7, 1999 entitled "Lossless Feedback Double-Balanced Active Mixers", application Ser. No. 9/349,224, by the same inventor the contents of which are incorporated herein by reference.

BACKGROUND OF THE INVENTION

Mixers are used in communications circuits for the purpose of generating a modulated carrier for transmission, demodulating a modulated carrier in reception, or converting a signal at some input intermediate frequency (IF) to another output radio frequency (RF) by multiplying two input signals and thereby generating a third. A number of mixer realizations, both passive and active, are known in the art, and double-balanced mixers are known particularly well due to their advantages in the suppression of unwanted spurious signals and the isolation of any one of three ports to the other two, there generally being two inputs and one output. The Gilbert Cell has been the most widely used active mixer circuit for performing the above tasks, usually incorporated within an integrated circuit. It does, however, possess certain limitations in terms of intermodulation (IM) distortion and noise figure (NF) that precludes it's use in communications systems having demanding performance specifications. The series-shunt feedback double-balanced active mixer delivers a much improved IM performance, but the lossy nature of the feedback topology does not improve the NF performance. The lossless feedback double-balanced active mixer overcomes the noise limitations of the series-shunt feedback active mixer, but still retains a significant source of IM distortion. The purpose of the present invention is to address the source of IM distortion in the lossless feedback double-balanced active mixer and significantly reduce it's impact on the mixer linearity.

Figure 1:
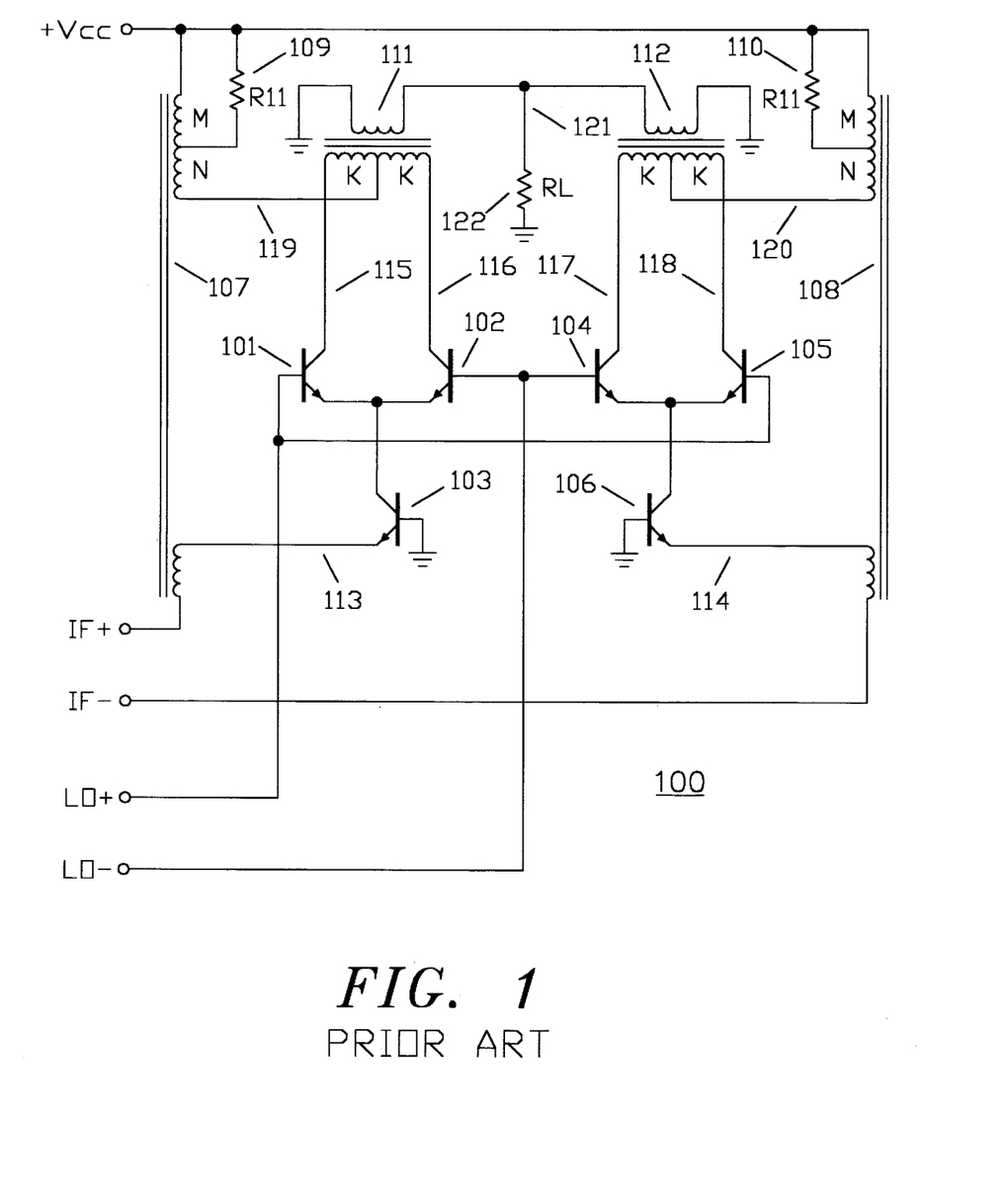
FIG. 1 schematically illustrates the existing prior art, commonly referred to as a lossless feedback double-balanced active mixer.

Referring to FIG. 1, a schematic diagram of a lossless feedback double-balanced active mixer is shown in functional form. Here, the mixer is comprised of switching transistors 101, 102, 104, and 105, which are turned on (saturation) and off (cutoff) alternately by a differentially applied local oscillator (LO) signal. By this switching action, a pair of currents generated by driver transistors 103 and 106 are divided into four paths, there being two paths for each of two currents. The currents generated by driver transistors 103 and 106 are the result of an input intermediate frequency (IF) signal applied differentially to the input windings of a pair of feedback transformers 107 and 108. The hybrid transformers 111 and 112 combine the four currents from switching transistors 101, 102, 104, and 105, creating a differential pair of feedback currents 119 and 120, as well as an output RF signal 121. The feedback currents 119 and 120 are coupled to the output windings of feedback transformers 107 and 108, respectively, thereby forming a pair of lossless feedback amplifiers which serve to establish the conversion gain and improve the IM performance of the mixer.

Those familiar with the art will readily understand that the improved NF performance of the lossless feedback double-balanced active mixer is a result of the lack of additional noise sources in the embedding topology. This active mixer offers considerable advantages over the more traditional Gilbert Cell active mixer, especially in terms of signal-handling and performance variations over temperature due to the temperature dependency of the emitter resistance $r_e$ of the driver transistors, and the tradeoffs that are encountered in receiver and transmitter system design. It further provides substantial NF improvement over the Gilbert Cell mixer and the series-shunt feedback mixer.

Those familiar with the art will also readily understand that the IM performance of the lossless feedback double-balanced active mixer is impaired by the nonlinear emitter resistance $r_e$ of the driver transistors 103 and 106. Although this mixer offers substantial advantages in IM performance over the more traditional Gilbert cell active mixer, the presence of the nonlinear driver transistor emitter resistance causes the IM performance of the lossless feedback double-balanced active mixer to be less than ideal. This resistance is also the principal cause of conversion gain variation with temperature. It has long been desirable that a mixer, either passive or active, be available that has improved IM and temperature performance, and at the same time has an improved NF performance without the expense of added power.

It is the purpose of this invention to further advance the art of feedback mixers by addressing the primary source of IM distortion present in the lossless feedback double-balanced active mixer, and to therefore provide an active mixer of markedly improved IM performance, while at the same time conserving power consumption and retaining the NF performance and overall sense of simplicity and cost effectiveness of the lossless feedback double-balanced active mixer.

SUMMARY OF THE INVENTION

A lossless feedback double-balanced active mixer circuit with improved intermodulation (IM) and noise figure (NF) performance is described which includes a pair of lossless feedback balanced active mixer circuits, each of which includes a differential pair of switching transistors which divide a controlled current into two paths at a rate determined by an input local oscillator (LO). A hybrid transformer in each lossless feedback balanced mixer, consisting of a centre-tapped primary winding and a secondary winding, combines the two currents to provide a recombined amplified IF signal and an output radio frequency (RF) signal. A third driver transistor in each lossless feedback active mixer circuit provides the controlled current, which is determined by an input intermediate frequency (IF) signal. Each lossless feedback active mixer circuit further includes a feedback transformer, comprised of an input winding and a tapped output winding, which compares the input IF signal with the recombined amplified IF signal from the hybrid transformers and applies the difference as a correction to the amplifying transistors, thereby completing a lossless feedback amplifier circuit and in turn improving the IM performance of the mixer circuit. An augmentation circuit is included which improves the IM performance still further. Since the feedback transformer introduces no significant sources of noise to the active mixer circuit, the NF of the of the lossless feedback active mixer circuit remains unimpaired beyond the NF of the transistors themselves. The connection of the secondary windings of the hybrid transformers of the lossless feedback active mixer circuits effectively cancels the output LO and IF signals and provides an output RF signal.

BRIEF DESCRIPTION OF THE DRAWINGS

The invention is described in the schematics of FIGS. 1 to 10, in which.

DETAILED DESCRIPTION OF THE PREFERRED EMBODIMENT

Designers of radio communication receivers are always concerned with elements of system performance which includes, but is not limited to, intermodulation distortion (IM), noise figure (NF), and power consumption. Historically, the IM performance of communications receivers is improved by methods that invariably require additional power consumption. Amplification stages with feedback methods are widely used as they offer far better IM performance while consuming less power than those not employing feedback. The NF of communications receivers is determined by the NF performance of the first stages of the receiver, which usually have sufficiently low NF and suitable signal gain to overcome the IM and NF performance of the first mixer stage, which is traditionally the primary source of distortion and noise. This invention now presents a mixer circuit which achieves a markedly improved IM and NF performance without excessive power consumption by applying a feedback method widely used in amplifier design which introduces no significant noise sources in addition to those of the active devices themselves. The IM performance is further improved by introducing an augmentation circuit which corrects a significant source of IM distortion.

A typical lossless feedback double-balanced active mixer circuit is shown in FIG. 1. Here, transistor 103 and transformer 107 form a lossless feedback amplifier on the left side, while transistor 106 and transformer 108 form a lossless feedback amplifier on the right side. Transistors 101 and 102 form a chopper for the left side and transistors 104 and 105 form a chopper for the right side. Hybrid transformer 111 combines the currents from transistors 101 and 102, the sum of which appears at the centre tap while the difference appears at the secondary winding. A similar description can be made for the second hybrid transformer 112 on the right side. A differential input Intermediate Frequency (IF) signal connected to the input windings of transformers 107 and 108 generates a differential pair of input currents 113 and 114:

$$I_{113} = I_Q + \frac{A \times \cos\omega_S t}{R_{in}} \quad (1)$$

$$I_{114} = I_Q - \frac{A \times \cos\omega_S t}{R_{in}} \quad (2)$$

where $\omega_S$ is the frequency and A is the amplitude of the input IF signal, $I_Q$ is the quiescent bias current, and $R_{in}$ is the input resistance which is defined as:

$$R_{in} = \frac{M + N + 1}{M^2} \times R_{11} \quad (3)$$

where M and N are the turns ratios of the output windings of transformers 107 and 108. These input currents are conducted to the emitters of a pair of driver transistors 103 and 106, respectively, which in turn conduct the currents to a first differential pair of switching transistors 101 and 102 and a second differential pair of switching transistors 104 and 105. A Local Oscillator (LO) signal applied differentially across the base terminals of the differential switching transistor pairs results in two differential pairs of output currents:

$$I_{115} = I_{113} \times \frac{1 - \cos\omega_L t}{2} \quad (4)$$
$$= \frac{I_Q \times (1 - \cos\omega_L t)}{2} +$$
$$\frac{A \times \left[\cos\omega_S t - \frac{\cos(\omega_S - \omega_L)t + \cos(\omega_S + \omega_L)t}{2}\right]}{2 \times R_{in}}$$

$$I_{116} = I_{113} \times \frac{1 + \cos\omega_L t}{2} \quad (5)$$
$$= \frac{I_Q \times (1 + \cos\omega_L t)}{2} +$$
$$\frac{A \times \left[\cos\omega_S t + \frac{\cos(\omega_S - \omega_L)t + \cos(\omega_S + \omega_L)t}{2}\right]}{2 \times R_{in}}$$

-continued $$I_{117} = I_{114} \times \frac{1 + \cos\omega_L t}{2} \quad (6)$$

$$= \frac{I_Q \times (1 + \cos\omega_L t)}{2} -$$

$$\frac{A \times \left[\cos\omega_S t - \frac{\cos(\omega_S - \omega_L)t + \cos(\omega_S + \omega_L)t}{2}\right]}{2 \times R_{in}}$$

$$I_{118} = I_{114} \times \frac{1 - \cos\omega_L t}{2} \quad (7)$$

$$= \frac{I_Q \times (1 - \cos\omega_L t)}{2} -$$

$$\frac{A \times \left[\cos\omega_S t - \frac{\cos(\omega_S - \omega_L)t + \cos(\omega_S + \omega_L)t}{2}\right]}{2 \times R_{in}}$$

where $\omega_S$ is the frequency of the input LO signal. If both hybrid transformers 111 and 112 have turns ratios of 1:1:1 (K=1), then the currents at the center taps of the hybrid transformers 111 and 112 are, respectively:

$$I_{119} = I_{115} + I_{116} = I_Q + \frac{A \times \cos\omega_S t}{R_{in}} \quad (8)$$

$$I_{120} = I_{117} + I_{118} = I_Q - \frac{A \times \cos\omega_S t}{R_{in}} \quad (9)$$

and the output signal current conducted to the load resistance $R_L$ is:

$$i_{121} = K \times (I_{115} - I_{116}) - K \times (I_{117} - I_{118}) \quad (10)$$

$$= 2 \times A \times K^2 \times \frac{\cos(\omega_S - \omega_L)t + \cos(\omega + \omega_L)t}{R_{in}}$$

which makes the output signal voltage equal to:

$$v_{121} = 2 \times A \times K^2 \times R_L \times \frac{\cos(\omega_S - \omega_L)t + \cos(\omega_S + \omega_L)t}{R_{in}} \quad (11)$$

The input currents $I_{113}$ and $I_{114}$ of transistors 103 and 106, determined earlier by EQ. 1 and EQ. 2, respectively, result in error voltages at the emitters of transistors 103 and 106, which are, respectively:

$$V_{113} = I_{113} \times \left(r_e + \frac{r_{bb}}{h_{fe} + 1}\right) \cong I_{113} \times r_{e103} \quad (12)$$

$$V_{114} = I_{114} \times \left(r_e + \frac{r_{bb}}{h_{fe} + 1}\right) \cong I_{114} \times r_{e106} \quad (13)$$

where the nonlinear input resistances $r_{e103}$ and $r_{e106}$ of the driver transistors 103 and 106 are determined, respectively, by:

$$r_{e103} = \frac{V_{113}}{I_{113}} = \frac{V_{113}}{I_O \times e^{\frac{qV_{113}}{kT}}} \quad (14)$$

$$r_{e106} = \frac{V_{114}}{I_{114}} = \frac{V_{114}}{I_O \times e^{\frac{qV_{114}}{kT}}} \quad (15)$$

These nonlinear resistances are the primary cause of nonlinear distortion in the lossless feedback double-balanced mixer, and their reduction is essential to improving the linearity of the circuit. While they can be reduced partially by increasing the quiescent bias current $I_Q$, it is preferable that other means not requiring substantial increases in power consumption be applied.

Figure 2:
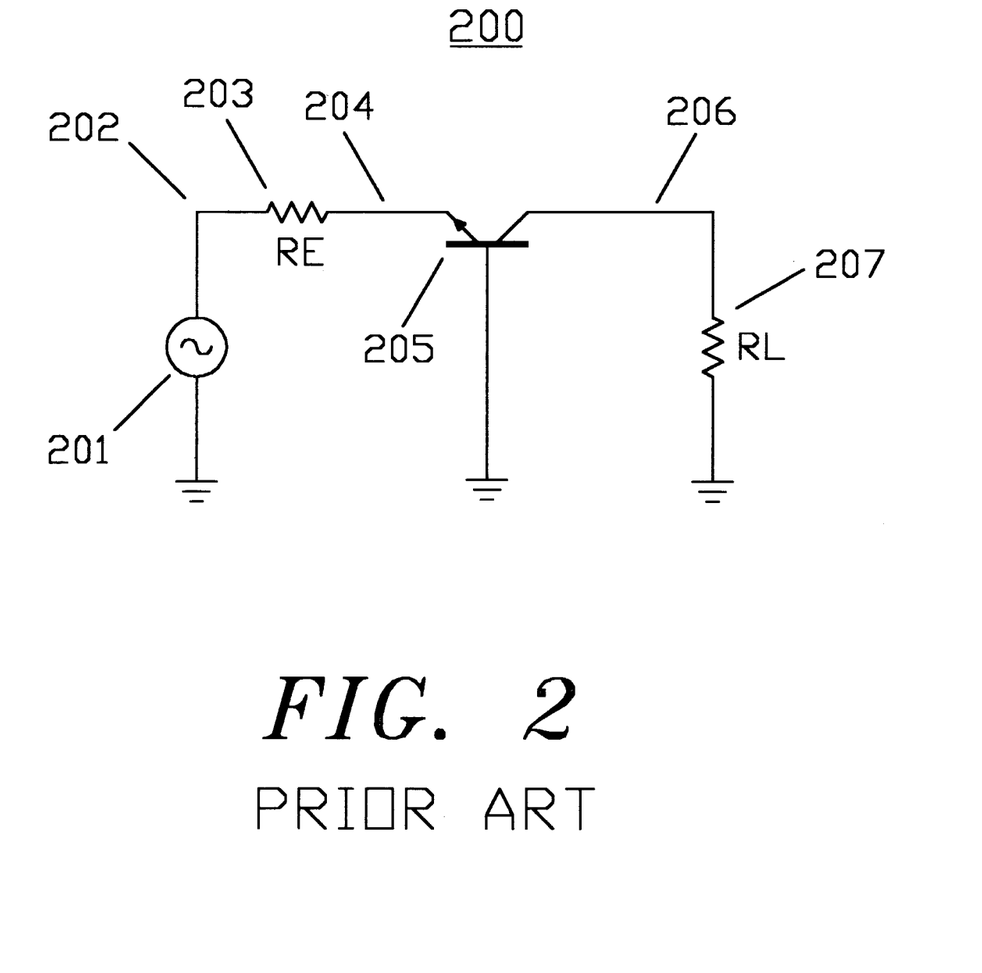
FIG. 2 schematically illustrates a common-base transistor amplifier.

Referring to FIG. 2, a circuit commonly referred to as a common-base transistor amplifier circuit 200 is shown in its most basic form. Here, a transistor 205 has its base connected to ground, hence the term common-base. A resistance 203 (illustrated as a fixed resistance $R_E$ for convenience), is connected from a signal voltage source 201, having an amplitude A and a frequency of $\omega_S$, to an emitter of transistor 205. A collector of transistor 205 is connected through a load resistance 207 (illustrated as a fixed resistance $R_L$ for convenience) to a common point, such as ground. An output voltage 206 is described by the equation:

$$V_{206} = I_C \times R_L \quad (16)$$

where $I_C$ is the instantaneous collector current of transistor 205. This collector current is related to the input emitter current $I_E$ by the equation:

$$I_C = \frac{I_E \times h_{fe}}{h_{fe} + 1} \quad (17)$$

where $h_{fe}$ is the signal current gain of transistor 205. The input emitter current $I_E$ is a result of the input signal voltage at 202 and the input resistance $R_{in}$, which is approximately described by:

$$R_{in} = R_E + r_e + \frac{r_{bb}}{h_{fe} + 1} \cong R_E + r_e \quad (18)$$

where $r_{bb}$ is the base spreading resistance and $r_e$ is the nonlinear incremental emitter resistance of transistor 205, the latter of which is described by:

$$r_e = \frac{V_{BE}}{I_E} = \frac{V_{BE}}{I_O \times e^{\frac{qV_{BE}}{kT}}} \quad (19)$$

where $I_O$ is the saturation current and $V_{BE}$ is the base-emitter voltage of transistor 205, the latter of which is equal to $-V_{204}$. This voltage constitutes an error voltage 204 at the emitter of transistor 205, which can be described as:

$$V_{204} = V_{202} \times \frac{r_e}{R_E + r_e} \quad (20)$$

Examination of EQ. 18 and EQ. 20 shows that as the emitter resistance term is reduced, the input resistance $R_{in}$ more closely approximates the fixed emitter resistance $R_E$. This, in turn, reduces the emitter error voltage $V_{204}$, thus linearizing the input resistance $R_E$ and the input current $I_E$, which results in a linear collector current and thus linearizes the amplifier. Similarly, reducing the emitter error voltage $V_{204}$, creating a virtual ground at the emitter terminal of transistor 205, has the same effect.

Figure 3:
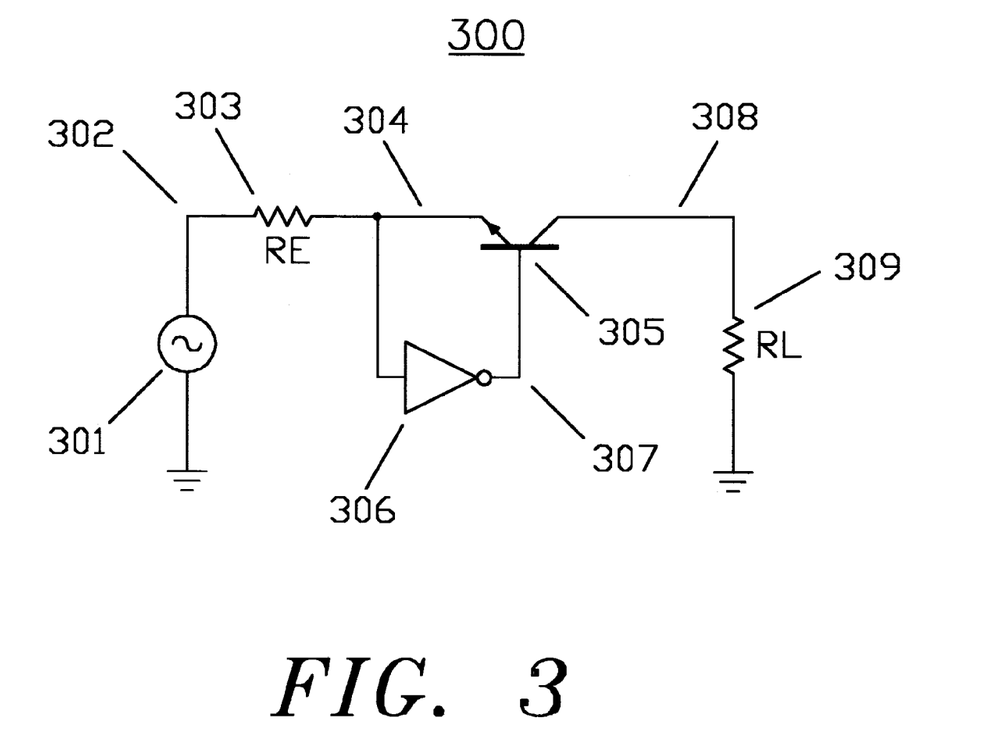
FIG. 3 schematically illustrates the combination of an augmenting voltage amplifier and a common-base transistor amplifier.

Turning now to FIG. 3, a circuit commonly known as an augmented common-base transistor amplifier circuit 300 is illustrated. Circuit 300 includes an input signal source 301, supplying an input signal voltage 302, which is coupled through a resistance 303 (illustrated as a fixed resistance $R_E$ for convenience) to the emitter of a transistor 305. An augmentation circuit including an inverting voltage amplifier 306 has an input connected to the emitter of transistor 305 and an output connected to the base of transistor 305. The collector of transistor 305 produces an output voltage 308 across a load resistance 309 (illustrated as a fixed resistance $R_L$ for convenience), the opposite end of which is connected to a common point, such as ground. It will of course be understood that in accordance with common practice the input signal source 301 and the load resistance 309 represent any convenient input and output apparatus, respectively. The augmentation amplifier 306 has an inverting voltage gain factor of $-A_V$, producing an amplified error voltage 307, which is applied to the base of transistor 305. This voltage is described as:

$$V_{307} = -A_V \times V_{304} \tag{21}$$

where $V_{304}$ is the is the emitter voltage 304. The resulting base-emitter voltage $V_{BE}$ of transistor 305 becomes:

$$V_{BE} = V_{307} - V_{304} = -A_V \times V_{307} - V_{304} = -V_{304} \times (A_V + 1) \tag{22}$$

Substituting EQ. 22 into EQ. 19, we find that the apparent emitter resistance $r_e'$ becomes:

$$r_e' = \frac{V_{304}}{I_E} = \frac{V_{304}}{I_O \times e^{\frac{qV_{304} \times (A_V+1)}{kT}}} = \frac{V_{BE}}{(A_V+1) \times I_O e^{\frac{qV_{BE}}{kT}}} \tag{23}$$

Figure 4:
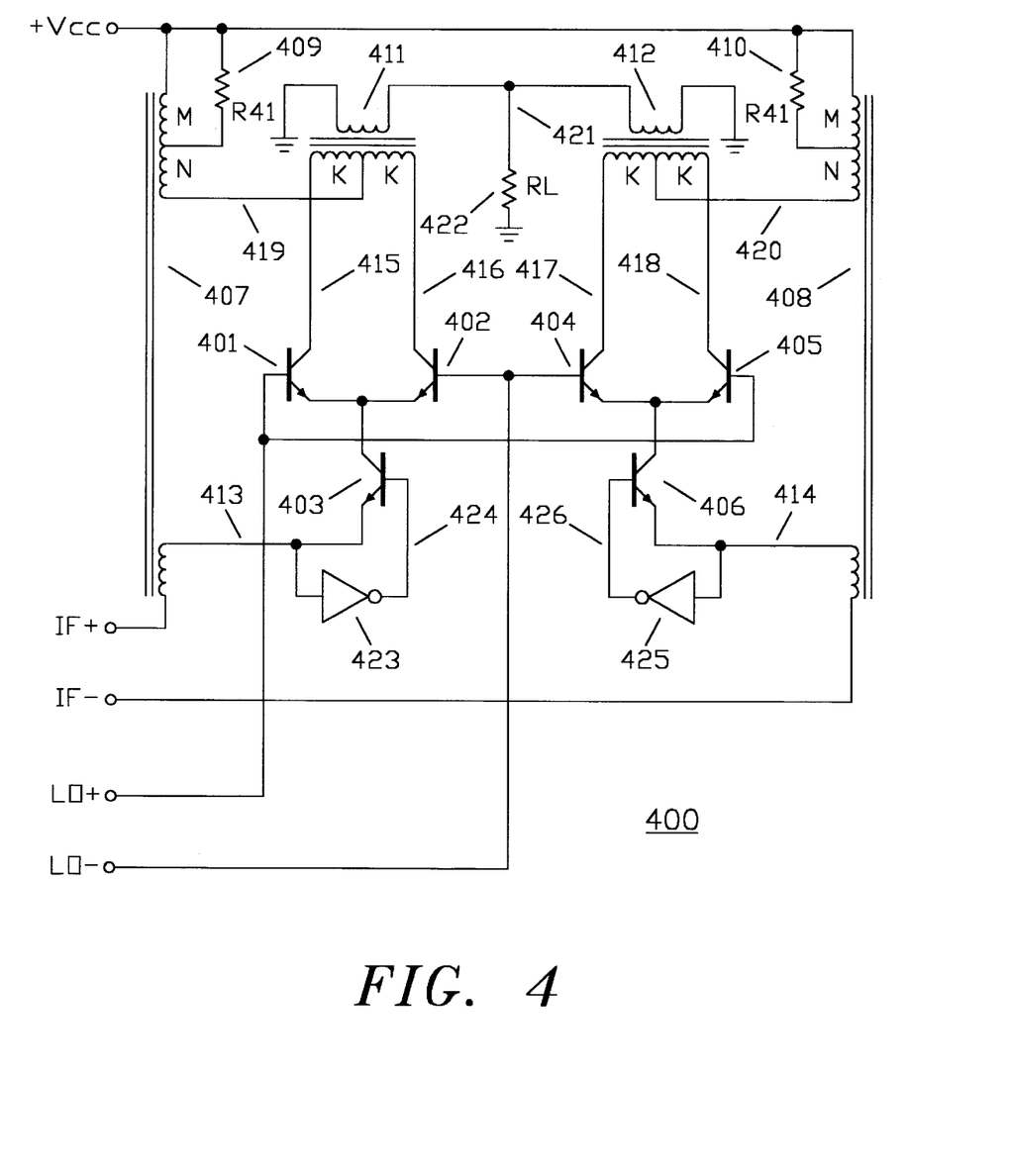
FIG. 4 schematically illustrates the combination of an augmenting voltage amplifier and a lossless feedback double-balanced active mixer in accordance with the present invention, FIG. 5 schematically illustrates the combination of a common-emitter augmenting amplifier and a common-base transistor amplifier.

Referring now to FIG. 4, an embodiment of an augmented lossless feedback double-balanced active mixer circuit in accordance with the present invention, designated 400, is illustrated. Here, transistor 403 and transformer 407 form a lossless feedback amplifier on the left side, while transistor 406 and transformer 408 form a lossless feedback amplifier on the right side. A differential pair of input currents 413 and 414 are conducted to the emitters of driver transistors 403 and 406, respectively, which in turn are conducted to a first differential pair of switching transistors 401 and 402 and second differential pair of switching transistors 404 and 405. Hybrid transformer 411 combines the currents 415 and 416 from transistors 401 and 402, the sum of which appears as a feedback current 419 at a centre tap while the difference appears at a secondary winding. Similarly, hybrid transformer 412 combines the currents 417 and 418 from transistors 404 and 405, the sum of which appears as a feedback current 420 at a centre tap while the difference appears at a secondary winding.

The two output currents from the secondary windings of hybrid transformers 411 and 412 are combined to form an output voltage 421 across an output load resistance 422 (illustrated as a fixed resistance $R_L$ for convenience). The feedback current 419 is conducted to an output winding of feedback transformer 407, where a resistor 409 (illustrated as a fixed resistance $R_{41}$ for on-venience) serves to terminate the first amplified IF signal. Similarly, the feedback current 420 is conducted to an output winding of feedback transformer 408, where a resistor 410 (illustrated as a fixed resistance $R_{41}$ for convenience) serves to terminate the second amplified IF signal.

A differential input Intermediate Frequency (IF) signal connected to the input windings of transformers 407 and 408 generates the differential pair of input currents 413 and 414:

$$I_{413} = I_Q + \frac{A \times \cos\omega_S t}{R_{in}} \tag{24}$$

$$I_{414} = I_Q - \frac{A \times \cos\omega_S t}{R_{in}} \tag{25}$$

where $\omega_S$ is the frequency and A is the amplitude of the input IF signal, $I_Q$ is the quiescent bias current, and $R_{in}$ is the input resistance which is defined as:

$$R_{in} = \frac{M+N+1}{M^2} \times R_{41} \tag{26}$$

where M and N are the turns ratios of the output windings of transformers 407 and 408. These input currents result in a differential pair of nonlinear error voltages at the emitters of transistors 403 and 406:

$$v_{413} = i_{413} \times \left(r_e + \frac{r_{bb}}{h_{fe}+1}\right) \cong i_{413} \times r'_{e403} \tag{27}$$

$$v_{414} = i_{414} \times \left(r_e + \frac{r_{bb}}{h_{fe}+1}\right) \cong i_{414} \times r'_{e406} \tag{28}$$

where $r'_{e403}$ and $r'_{e406}$ are the apparent emitter input resistances of the driver transistors 403 and 406, respectively. Assuming that the augmentation amplifiers 423 and 425 have equal voltage gain factors of $-A_V$, the amplified error voltages 424 and 426 at the bases of transistors 403 and 406 are, respectively:

$$v_{424} = -A_V \times v_{413} \tag{29}$$

$$v_{426} = -A_V \times v_{414} \tag{30}$$

Substituting EQ. 29 and EQ. 30 into EQ. 23, the equivalent emitter resistances of transistors 403 and 406 are, respectively:

$$r'_{e403} = \frac{V_{413}}{I_{413}} = \frac{V_{413}}{I_O \times e^{\frac{qV_{413} \times (A_V+1)}{kT}}} = \frac{V_{BE}}{(A_V+1) \times I_O \times e^{\frac{qV_{BE}}{kT}}} \tag{31}$$

$$r'_{e406} = \frac{V_{414}}{I_{414}} = \frac{V_{414}}{I_O \times e^{\frac{qV_{414} \times (A_V+1)}{kT}}} = \frac{V_{BE}}{(A_V+1) \times I_O \times e^{\frac{qV_{BE}}{kT}}} \tag{32}$$

thus showing that the inclusion of the augmenting voltage amplifiers 423 and 425 in the lossless feedback double-balanced active mixer circuit 400 of FIG. 4 achieves the necessary condition for improving the linearity of the circuit. From inspection of EQ. 31 and 32 it can be seen that the apparent emitter resistance $r_e'$ is greatly reduced as the voltage gain $A_V$ of augmentation amplifiers 423 and 425 are increased, and that the input resistance becomes more closely equal to the fixed input resistance $R_E$ as the voltage gain is increased, thus showing that the addition of augmentation amplifiers 423 and 425 have caused the emitter terminals of transistors 403 and 406, respectively, to appear as virtual grounds, thus achieving the necessary condition discussed earlier for linearizing a lossless feedback double-balanced active mixer.

Figure 5:
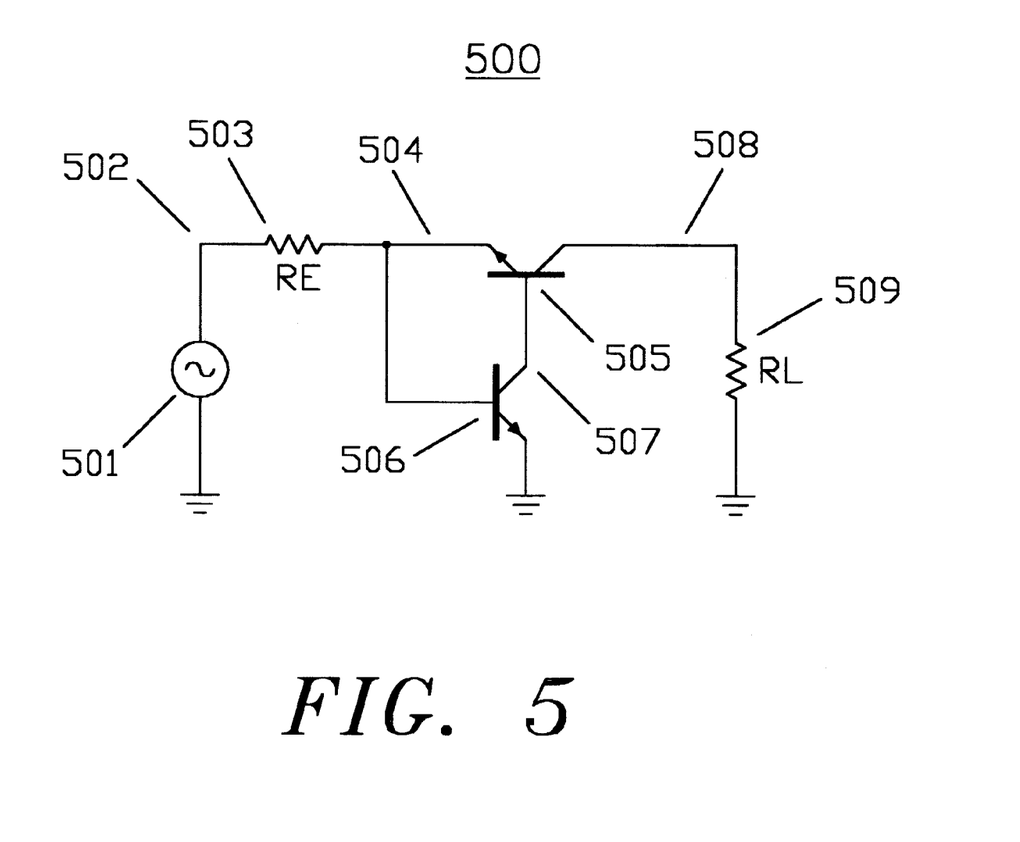

In some applications, particularly those at higher frequencies, the use of augmentation amplifiers 423 and 425 as shown in FIG. 4 may be impractical. Referring to FIG. 5, an augmented common-base transistor amplifier circuit 500, employing a common-emitter transistor amplifier for augmentation, is illustrated. Circuit 500 includes an input signal voltage source 501, supplying an input signal voltage 502, which is coupled through a resistance 503 (illustrated as a fixed resistance $R_E$ for convenience) to the emitter of a transistor 505. An augmentation circuit including a common-emitter transistor amplifier 506 has a base connected to the emitter of transistor 505, a grounded or common emitter, and a collector connected to the base of transistor 505, which produces a base voltage 507 of transistor 505. The collector of transistor 505 produces an output voltage 508 across a load resistance 509 (illustrated as a fixed resistance $R_L$ for convenience), the opposite end of which is connected to a common point, such as ground. It will of course be understood that in accordance with common practice the input signal source 501 and the load resistance 509 represent any convenient input and output apparatus, respectively. In this case, the input current at the emitter of transistor 505 is described as:

$$I'_E = I_{E1} + I_{B2} \tag{33}$$

$$= I_{B1} \times (h_{fe1} + 1) + \frac{I_{B1}}{h_{fe2}}$$

$$= \left(h_{fe1} + 1 + \frac{1}{h_{fe2}}\right) \times I_{O2} \times e^{\frac{qV_{BE}}{kT}}$$

where $h_{fe1}$ is the signal current gain of transistor 505, $h_{fe2}$ is the signal current gain of transistor 506, $I_{O2}$ is the saturation current of transistor 506, and $V_{BE}$ is the base-emitter voltage of transistor 505. Substituting EQ. 33 into EQ. 19, we find that the apparent emitter resistance $r_e'$ becomes approximately:

$$r'_e = \frac{V_{504}}{I'_E} = \frac{V_{504}}{\left(h_{fe1} + 1 + \frac{1}{h_{fe2}}\right) \times I_{O2} \times e^{\frac{qV_{BE}}{kT}}} \tag{34}$$

which is a considerable reduction in the nonlinear emitter resistance of the common-base transistor amplifier, and thus showing that the use of common-emitter transistor amplifier 506 fulfills the requirements for linearizing the common-base transistor amplifier circuit 200 of FIG. 2.

Figure 6:
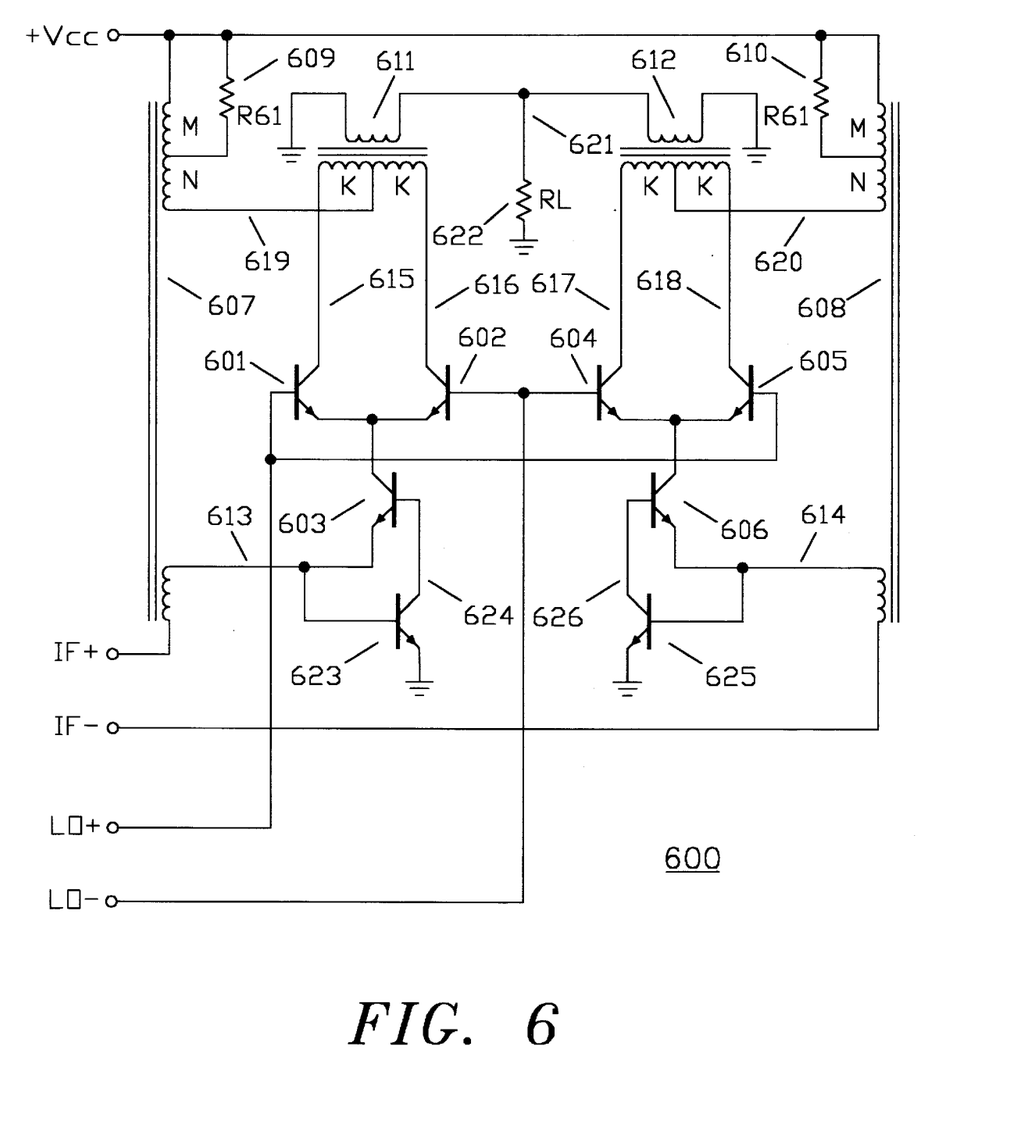
FIG. 6 schematically illustrates the combination of a common-emitter augmenting amplifier and a lossless feedback double-balanced active mixer in accordance with the present invention.

Referring now to FIG. 6, an embodiment of an augmented lossless feedback double-balanced active mixer circuit in accordance with the present invention, designated 600, is illustrated. Here, transistor 603 and transformer 607 form a lossless feedback amplifier on the left side, while transistor 606 and transformer 608 form a lossless feedback amplifier on the right side. A differential pair of input currents 613 and 614 are conducted to the emitters of driver transistors 603 and 606, respectively, which in turn are conducted to a first differential pair of switching transistors 601 and 602 and second differential pair of switching transistors 604 and 605. Hybrid transformer 611 combines the currents 615 and 616 from transistors 601 and 602, the sum of which appears as a feedback current 619 at a centre tap while the difference appears at a secondary winding. Similarly, hybrid transformer 612 combines the currents 617 and 618 from transistors 604 and 605, the sum of which appears as a feedback current 620 at a centre tap while the difference appears at a secondary winding.

The two output currents from the secondary windings of hybrid transformers 611 and 612 are combined to form an output voltage 621 across the output load resistance 622 (illustrated as a fixed resistance $R_L$ for convenience). The feedback current 619 is conducted to an output winding of feedback transformer 607, where a resistor 609 (illustrated as a fixed resistance $R_{61}$ for convenience) serves to terminate the first amplified IF signal. Similarly, the feedback current 620 is conducted to an output winding of feedback transformer 608, where a resistor 610 (illustrated as a fixed resistance $R_{61}$ for convenience) serves to terminate the second amplified IF signal.

A differential input Intermediate Frequency (IF) signal connected to the input windings of transformers 607 and 608 generates the differential pair of input currents 613 and 614:

$$I_{613} = I_Q + \frac{A + \cos\omega_S t}{R_{in}} \tag{35}$$

$$I_{614} = I_Q - \frac{A \times \cos\omega_S t}{R_{in}} \tag{36}$$

where $\omega_S$ is the frequency and A is the amplitude of the input IF signal, $I_Q$ is the quiescent bias current, and $R_{in}$ is the input resistance which is defined as:

$$R_{in} = \frac{M + N + 1}{M^2} \times R_{61} \tag{37}$$

where M and N are the turns ratios of the output windings of transformers 607 and 608. These input currents result in a differential pair of nonlinear error voltages at the emitters of transistors 603 and 606:

$$v_{613} = i_{613} \times \left(r_e + \frac{r_{bb}}{h_{fe} + 1}\right) \cong i_{613} \times r'_{e603} \tag{38}$$

$$v_{614} = i_{614} \times \left(r_e + \frac{r_{bb}}{h_{fe} + 1}\right) \cong i_{614} \times r'_{e606} \tag{39}$$

where $r'_{e603}$ and $r'_{e606}$ are the apparent emitter input resistances of the driver transistors 603 and 606, respectively. Assuming that the augmentating common-emitter transistor amplifiers 623 and 625 have similar characteristics, the input currents at the emitters of transistors 603 and 606 are:

$$I'_{E603} = I_{E603} + I_{B623} \tag{40}$$

$$= I_{B623} \times (h_{fe1} + 1) + \frac{I_{B623}}{h_{fe2}}$$

$$= \left(h_{fe1} + 1 + \frac{1}{h_{fe2}}\right) \times I_{O2} \times e^{\frac{qV_{BE}}{kT}}$$

$$I'_{E606} = I_{E606} + I_{B625} \tag{41}$$

$$= I_{B625} \times (h_{fe1} + 1) + \frac{I_{B625}}{h_{fe2}}$$

$$= \left(h_{fe1} + 1 + \frac{1}{h_{fe2}}\right) \times I_{O2} \times e^{\frac{qV_{BE}}{kT}}$$

where $h_{fe1}$ is the signal current gain of transistors 603 and 606, $h_{fe2}$ is the signal current gain of transistors 623 and 625, $I_{O2}$ is the saturation current of transistors 623 and 625, and $V_{BE}$ is the base-emitter voltage of transistors 623 and 625. Substituting EQ. 40 and EQ. 41 into EQ. 14 and EQ. 15, the equivalent emitter resistances of transistors 603 and 606 are, respectively:

$$r'_{e603} = \frac{V_{613}}{I'_{E603}} = \frac{V_{BE}}{\left(h_{fe1} + 1 + \frac{1}{h_{fe2}}\right) \times I_{O2} \times e^{\frac{qV_{BE}}{kT}}} \quad (42)$$

$$r'_{e606} = \frac{V_{614}}{I'_{E606}} = \frac{V_{BE}}{\left(h_{fe1} + 1 + \frac{1}{h_{fe2}}\right) \times I_{O2} \times e^{\frac{qV_{BE}}{kT}}} \quad (43)$$

thus showing that the inclusion of the augmenting common-emitter transistor amplifiers 623 and 625 to the lossless feedback double-balanced active mixer circuit 600 of FIG. 6 achieves the necessary condition for improving the linearity of the circuit.

Figure 7:
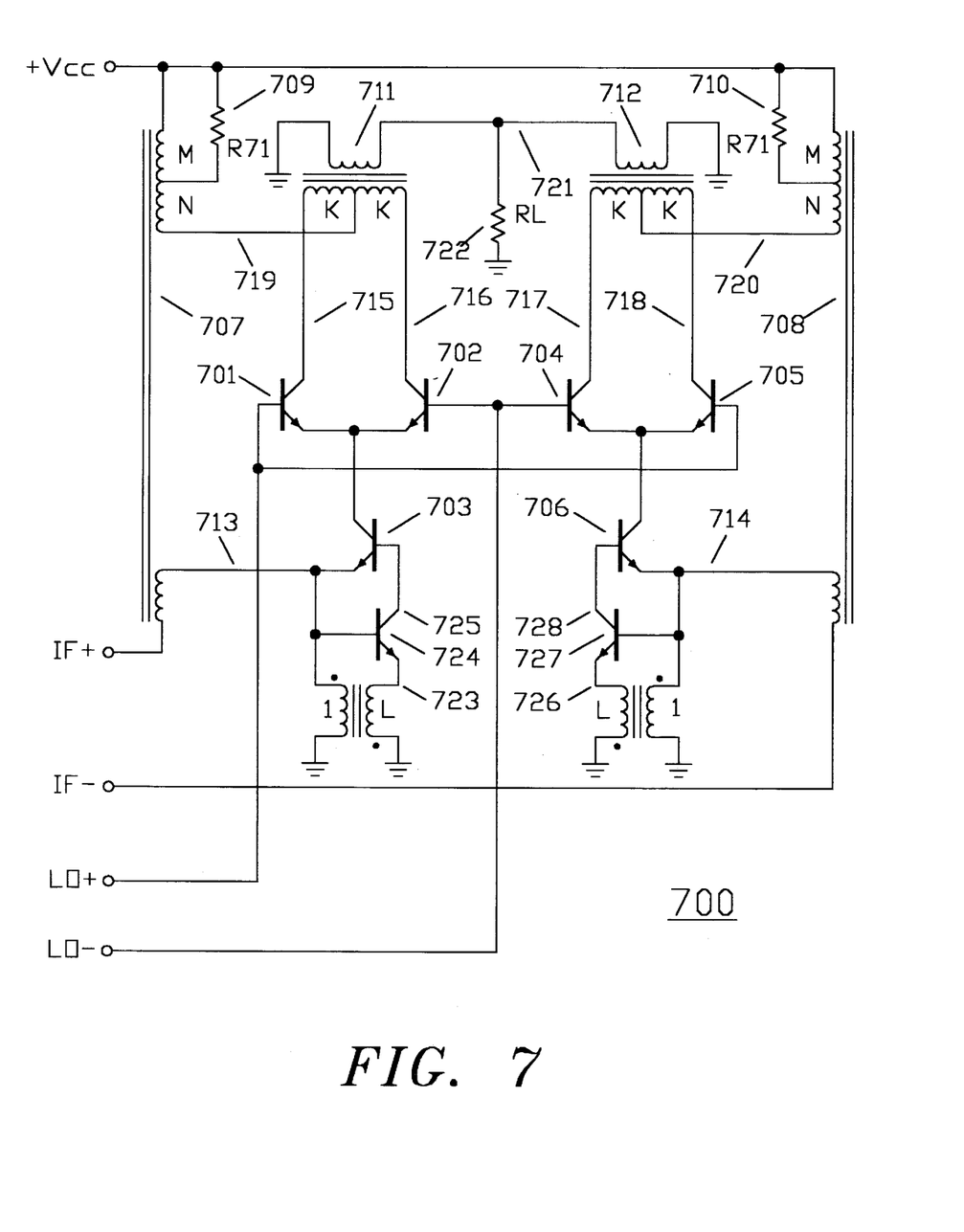
FIG. 7 schematically illustrates the combination of an inverting positive feedback amplifier and a lossless feedback double-balanced active mixer in accordance with the present invention.

For applications where higher degrees of linearity are required, the voltage gain of the augmenting common-emitter transistor amplifiers can be increased by providing a means of positive feedback. Referring specifically to FIG. 7, an embodiment of an augmented lossless feedback double-balanced active mixer circuit in accordance with the present invention, designated 700, is illustrated. Here, transistor 703 and transformer 707 form a lossless feedback amplifier on the left side, while transistor 706 and transformer 708 form a lossless feedback amplifier on the right side. A differential pair of input currents 713 and 714 are conducted to the emitters of driver transistors 703 and 706, respectively, which in turn are conducted to a first differential pair of switching transistors 701 and 702 and second differential pair of switching transistors 704 and 705. Hybrid transformer 711 combines currents 715 and 716 from transistors 701 and 702, the sum of which appears as a feedback current 719 at a centre tap while the difference appears at a secondary winding. Similarly, hybrid transformer 712 combines currents 717 and 718 from transistors 704 and 705, the sum of which appears as a feedback current 720 at a centre tap while the difference appears at a secondary winding.

The two output currents from the secondary windings of hybrid transformers 711 and 712 are combined to form an output voltage 722 across an output load resistance 722 (illustrated as a fixed resistance $R_L$ for convenience). The feedback current 719 is conducted to an output winding of feedback transformer 707, where a resistor 709 (illustrated as a fixed resistance $R_{71}$ for convenience) serves to terminate the first amplified IF signal. Similarly, the feedback current 720 is conducted to an output winding of feedback transformer 708, where a resistor 710 (illustrated as a fixed resistance $R_{71}$ for convenience) serves to terminate the second amplified IF signal.

The two input currents 713 and 714 induce error voltages at the emitters of driver transistors 703 and 706, respectively. A positive feedback augmentation amplifier consisting of a transistor 724 and a transformer 723 amplifies the error voltage at the emitter of driver transistor 703, which then conducts an amplified signal current 725 to the base of driver transistor 703, thereby providing an augmentation circuit of very high gain for the left side of the augmented lossless feedback double-balanced mixer circuit. Similarly, a positive feedback augmentation amplifier consisting of a transistor 727 and a transformer 726 amplifies the error voltage at the emitter of driver transistor 706, which then conducts an amplified signal current 728 to the base of driver transistor 706, thereby providing an augmentation circuit of very high gain for the right side of the augmented lossless feedback double-balanced active mixer circuit.

It will be recognized by those familiar to the art that the positive feedback amplifier represented by transistor 724 and transformer 723 and the positive feedback amplifier represented by transistor 727 and transformer 726 are but one of many methods by which a positive feedback amplifier suitable for augmentation may be realized.

Figure 8:
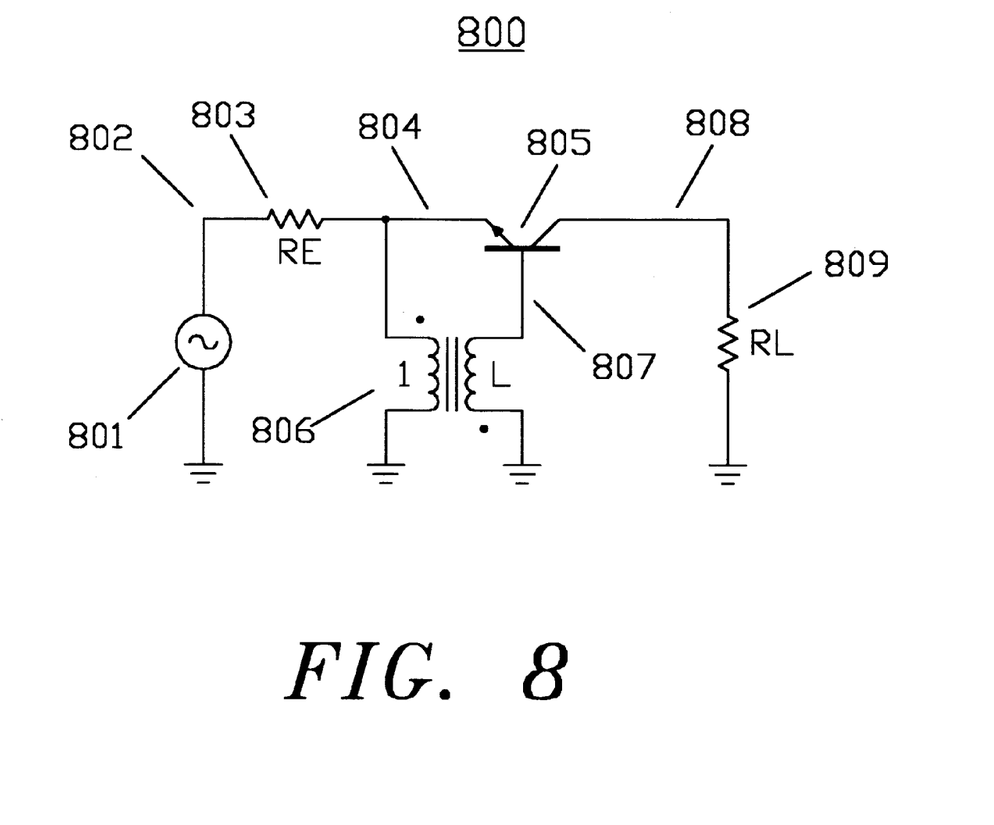
FIG. 8 schematically illustrates the combination of an augmenting transformer and a common-base transistor amplifier.

For applications at high frequencies and especially where the noise figure (NF) is a concern, an augmentation circuit including an active element such as a common-emitter transistor amplifier may be impractical. Referring specifically to FIG. 8, an augmented common-base transistor amplifier circuit, designated 800, using a simple transformer is illustrated. Circuit 800 includes an input voltage source 801, supplying an input signal voltage 802, which is coupled through a resistance 803 (illustrated as a fixed resistance $R_E$ for convenience) to the emitter of a transistor 805. An augmentation circuit including a transformer 806 has a primary winding connected between the emitter of transistor 805 and a common point, such as ground. A secondary winding of transformer 806 is connected, in reverse phase relative to the primary winding, between the base of transistor 805 and the common or ground, producing a base voltage 807. The collector of transistor 805 produces an output voltage 808 across a load resistance 809 (illustrated as a fixed resistance $R_L$ for convenience), the opposite end of which is connected to a common point, such as ground. It will of course be understood that in accordance with common practice the input signal source 801 and the load resistance 809 represent any convenient input and output apparatus, respectively. The base-emitter voltage $V_{BE}$, being the difference between base voltage 807 and emitter voltage 804, and the base current $I_B$ for circuit 800 are, respectively:

$$V_{BE} = V_{807} - V_{804} = -L \times V_{804} - V_{804} = -V_{804} \times (L+1) \quad (44)$$

$$I_B = \frac{I_E}{h_{fe}} \quad (45)$$

where L is the turns ratio of the secondary winding to the primary winding of transformer 806. This makes the input current $I_E'$ equal to:

$$I'_E = I_E - \frac{L \times I_E}{h_{fe}} = I_E \times \left(1 - \frac{L}{h_{fe}}\right) \quad (46)$$

where $$I_E = I_O \times e^{\frac{q(1+L)V_{404}}{kT}} = I_O \times \left[e^{\frac{qV_{404}}{kT}}\right]^{(1+L)} \quad (47)$$

which allows the apparent emitter resistance $r_e'$ to be approximated as:

$$r'_e = \frac{V_{804}}{I'_{E805}} \quad (48)$$

$$= \frac{V_{804}}{\left(1 - \frac{L}{h_{fe}}\right) \times I_O \times e^{\frac{q(L+1)V_{804}}{kT}}}$$

$$= \frac{V_{BE}}{(L+1) \times \left(1 - \frac{L}{h_{fe}}\right) \times I_O \times e^{\frac{qV_{BE}}{kT}}}$$

which, compared to EQ. 19, shows that the apparent emitter resistance $r_e'$ decreases dramatically as the turns ratio L of transformer 806 is increased, showing that the use of augmentation transformer 806 fulfills the requirements for linearizing the common-base transistor amplifier circuit 800 of FIG. 8.

Figure 9:
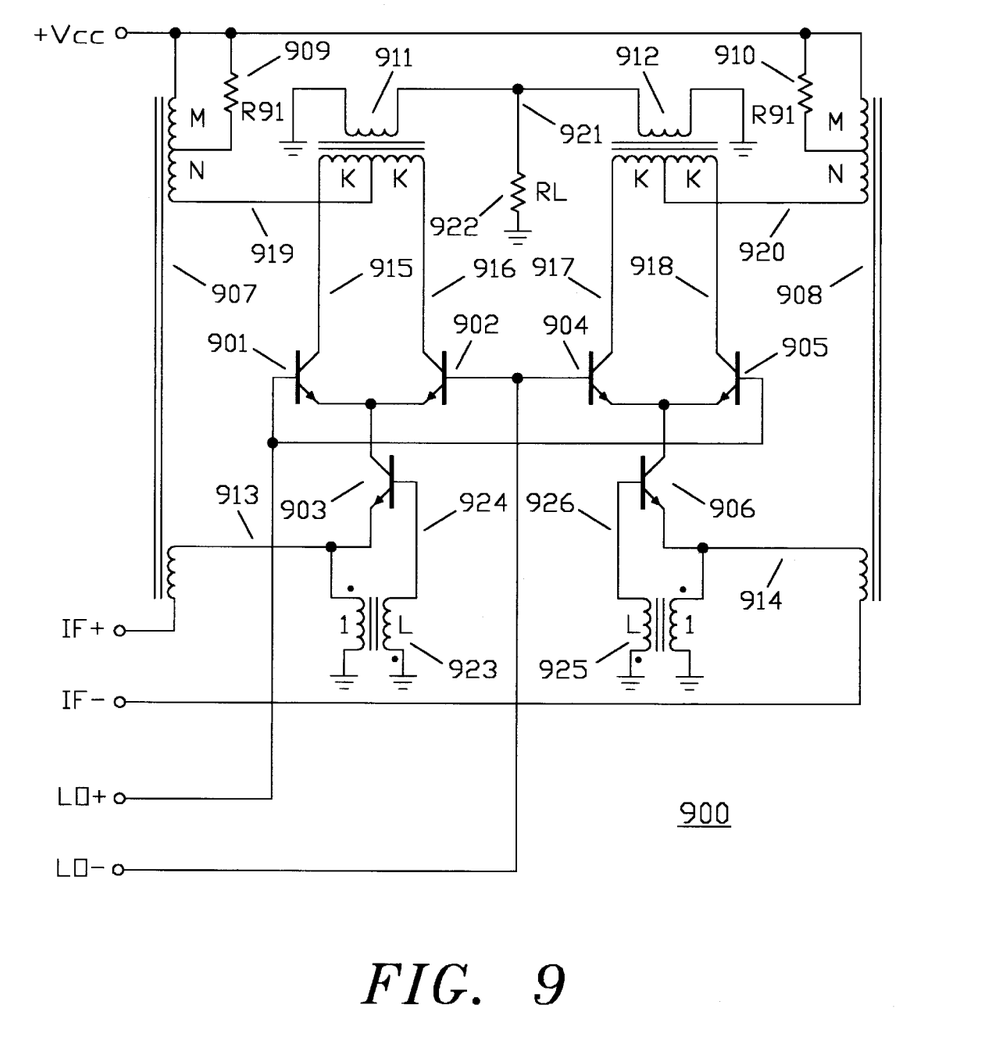
FIG. 9 schematically illustrates the combination of an augmenting transformer and a lossless feedback double-balanced active mixer in accordance with the present invention.

Referring now to FIG. 9, an embodiment of an augmented lossless feedback double-balanced active mixer circuit in accordance with the present invention, designated 900, is illustrated. Here, transistor 903 and transformer 907 form a lossless feedback amplifier on the left side, while transistor 906 and transformer 908 form a lossless feedback amplifier on the right side. A differential pair of input currents 913 and 914 are conducted to the emitters of driver transistors 903 and 906, respectively, which in turn are conducted to a first differential pair of switching transistors 901 and 902 and second differential pair of switching transistors 904 and 905. Hybrid transformer 911 combines currents 915 and 916 from transistors 901 and 902, the sum of which appears as a feedback current 919 at a centre tap while the difference appears at a secondary winding. Similarly, hybrid transformer 912 combines currents 917 and 918 from transistors 904 and 905, the sum of which appears as a feedback current 920 at a centre tap while the difference appears at a secondary winding.

The two output currents from the secondary windings of hybrid transformers 911 and 912 are combined to form an output voltage 921 across an output load resistance 922 (illustrated as a fixed resistance $R_L$ for convenience). The feedback current 919 is conducted to an output winding of feedback transformer 907, where a resistor 909 (illustrated as a fixed resistance $R_{91}$ for convenience) serves to terminate the first amplified IF signal. Similarly, the feedback current 920 is conducted to an output winding of feedback transformer 908, where a resistor 910 (illustrated as a fixed resistance $R_{91}$ for convenience) serves to terminate the second amplified IF signal.

A differential input Intermediate Frequency (IF) signal connected to the input windings of transformers 907 and 908 generates the differential pair of input currents 913 and 914:

$$I_{913} = I_Q + \frac{A \times \cos\omega_S t}{R_{in}} \quad (49)$$

$$I_{914} = I_Q - \frac{A \times \cos\omega_S t}{R_{in}} \quad (50)$$

where $\omega_S$ is the frequency and A is the amplitude of the input IF signal, $I_Q$ is the quiescent bias current, and $R_{in}$ is the input resistance which is defined as:

$$R_{in} = \frac{M+N+1}{M^2} \times R_{91} \quad (51)$$

where M and N are the turns ratios of the output windings of transformers 907 and 908. These input currents result in a differential pair of nonlinear error voltages at the emitters of transistors 903 and 906:

$$v_{913} = i_{913} \times \left(r_e + \frac{r_{bb}}{h_{fe}+1}\right) \cong i_{913} \times r'_{e903} \quad (52)$$

$$v_{914} = i_{914} \times \left(r_e + \frac{r_{bb}}{h_{fe}+1}\right) \cong i_{914} \times r'_{e906} \quad (53)$$

where $r'_{e903}$ and $r'_{e906}$ are the apparent emitter input resistances of the driver transistors 903 and 906, respectively. Assuming that the augmenting transformers 923 and 925 have similar characteristics, the input currents at the emitters of transistors 903 and 906 are:

$$I'_{E903} = I_{E903} - \frac{L \times I_{E903}}{h_{fe}} = I_{E903} \times \left(1 - \frac{L}{h_{fe}}\right) \quad (54)$$

$$I'_{E906} = I_{E906} - \frac{L \times I_{E906}}{h_{fe}} = I_{E906} \times \left(1 - \frac{L}{h_{fe}}\right) \quad (55)$$

where $h_{fe}$ is the signal current gain of transistors 903 and 906, and L is the turns ratios of the augmentation transformers 923 and 925. The base-emitter voltages for transistors 903 and 906 are:

$$V_{BE903}=V_{924}-V_{913}=-L \times V_{913}-V_{913}=-V_{913} \times (L+1) \quad (56)$$

$$V_{BE906}=V_{926}-V_{914}=-L \times V_{914}-V_{914}=-V_{914} \times (L+1) \quad (57)$$

Substituting EQ. 54 and EQ. 56 into EQ. 14 and substituting EQ. 55 and EQ. 57 into EQ. 15, the equivalent emitter resistances of transistors 903 and 906 are, respectively:

$$r'_{e903} = \frac{V_{913}}{I'_{E903}} \quad (58)$$

$$= \frac{V_{913}}{\left(1 - \frac{L}{h_{fe}}\right) \times I_O \times e^{\frac{q(L+1)V_{913}}{kT}}}$$

$$= \frac{V_{BE}}{(L+1) \times \left(1 - \frac{L}{h_{fe}}\right) \times I_O \times e^{\frac{qV_{BE}}{kT}}}$$

$$r'_{e906} = \frac{V_{914}}{I'_{E906}} \quad (58)$$

$$= \frac{V_{914}}{\left(1 - \frac{L}{h_{fe}}\right) \times I_O \times e^{\frac{q(L+1)V_{906}}{kT}}}$$

$$= \frac{V_{BE}}{(L+1) \times \left(1 - \frac{L}{h_{fe}}\right) \times I_O \times e^{\frac{qV_{BE}}{kT}}}$$

thus showing that the inclusion of the augmenting transformers 923 and 925 to the lossless feedback double-balanced active mixer circuit 900 of FIG. 9 achieves the necessary condition for improving the linearity of the circuit.

Although detailed embodiments of the invention have been described, it should be appreciated that numerous modifications, variations, and adaptations may be made without departing from the scope of the invention as described in the claims. For example, those familiar with the art will recognize that the bipolar transistors shown in the embodiments may be alternatively replaced with field effect transistors. Also, the single-transformer lossless feedback topology shown in the embodiments may be alternatively replaced with other forms of lossless feedback that are known to the art.

Further, while the terminals of the bipolar transistors described in the various embodiments are referred to as the emitter, base, and collector, it will be understood that these terminals will be the source, gate, and drain when the transistors utilized are field effect transistors or other similar types and may be referred to as input, control and output terminals, respectively, however the titles of the various components and terminals are only intended to enhance the understanding of the disclosure and are not intended to in any way limit the type of component utilized. In addition, it should be understood that the terms "lossless feedback transformer" and "hybrid transformer" used throughout this disclosure refer to general types of transformers and should not be limited in any way to specific types of transformers.

What is claimed is:

1. An augmented lossless feedback double-balanced active mixer circuit for mixing an input intermediate frequency (IF) signal and an input local oscillator (LO) signal and producing an output radio frequency (RF) signal comprising:
   a first pair of input terminals for receiving differential first and second IF input signals;
   a second pair of input terminals for receiving differential first and second LO input signals;
   an output terminal for providing an RF output signal;
   a first augmented lossless feedback balanced active mixer circuit having an IF input connected to the first IF signal input terminal of the augmented lossless feedback double-balanced active mixer circuit, differential first and second LO inputs connected one each to the differential first and second LO signal input terminals of the augmented lossless feedback double-balanced active mixer circuit, and an RF output connected to the RF output terminal of the augmented lossless feedback double-balanced active mixer circuit, the first augmented lossless feedback balanced mixer circuit further comprising:
      a first common-base transistor amplifier, having an input, an output, and a control, further comprising a first bipolar transistor having an emitter, a base, and a collector coupled to the input, control, and output, respectively, of the first common-base transistor amplifier,
      a first hybrid transformer, consisting of a primary winding having a first and second input and a centre-tap output, and a secondary winding with a first and second end, the first end connected to the RF output of the first augmented lossless feedback balanced mixer circuit and the second end connected to a signal ground,
      a first differential pair of switching transistors, each having a collector, an emitter, and a base, the collector of the first differential transistor connected to the first input of the first hybrid transformer, the collector of the second differential transistor connected to the second input of the first hybrid transformer, the bases of the differential transistors connected one each to the LO inputs of the first augmented lossless feedback balanced active mixer circuit, and the emitters of both differential transistors connected in common to the first common-base transistor amplifier output,
      a first lossless feedback transformer consisting of an input winding having a first end and a second end, the first end of the input winding connect to the IF input of the first augmented lossless feedback balanced mixer circuit and the second end of the input winding connected to the first common-base transistor amplifier input, and a tapped output winding having a first end, a second end, and a tap, the first end of the output winding connected to the primary centre tap of the first hybrid transformer and the second end of the output winding connected to a signal ground,
      a first augmentation circuit having an input and an output, the input coupled to the first common-base transistor amplifier input and the output coupled to the first common-base transistor amplifier control, and
      a first load resistor having a first end and a second end, the first end of the first load resistor connected to the output winding tap of the first lossless feedback transformer and the second end of the first load resistor connected to a signal ground; and
   a second augmented lossless feedback balanced active mixer circuit having an IF input connected to the second IF signal input terminal of the augmented lossless feedback double-balanced active mixer circuit, differential first and second LO inputs connected one each to the differential first and second LO signal input terminals of the augmented lossless feedback double-balanced active mixer circuit, and an RF output connected to the RF output terminal of the augmented lossless feedback double-balanced active mixer circuit, the second augmented lossless feedback balanced mixer circuit further comprising:
      a second common-base transistor amplifier, having an input, an output, and a control, further comprising a second bipolar transistor having an emitter, a base, and a collector coupled to the input, control, and output, respectively, of the second common-base transistor amplifier,
      a second hybrid transformer, consisting of a primary winding having a first and second input and a centre-tap output, and a secondary winding with a first and second end, the first end connected to the RF output of the second augmented lossless feedback balanced mixer circuit and the second end connected to a signal ground,
      a second differential pair of switching transistors, each having a collector, an emitter, and a base, the collector of the first differential transistor connected to the first input of the second hybrid transformer, the collector of the second differential transistor connected to the second input of the second hybrid transformer, the bases of the differential transistors connected one each to the LO inputs of the second augmented lossless feedback balanced active mixer circuit, and the emitters of both differential transistors connected in common to the second common-base transistor amplifier output,
      a second lossless feedback transformer consisting of an input winding having a first end and a second end, the first end of the input winding connect to the IF input of the second augmented lossless feedback balanced mixer circuit and the second end of the input winding connected to the second common-base transistor amplifier input, and a tapped output winding having a first end, a second end, and a tap, the first end of the output winding connected to the primary centre tap of the second hybrid transformer and the second end of the output winding connected to a signal ground,
      a second augmentation circuit having an input and an output, the input coupled to the second common-base transistor amplifier input and the output coupled to the second common-base transistor amplifier control, and
      a second load resistor having a first end and a second end, the first end of the first load resistor connected to the output winding tap of the second lossless feedback transformer and the second end of the first load resistor connected to a signal ground.

2. An augmented lossless feedback double-balanced active mixer circuit, as claimed in claim 1, wherein the first augmentation circuit further includes a first inverting voltage amplifier, having an input and an output, the input connected to the input of the first augmentation circuit and the output connected to the output of the first augmentation circuit, and the second augmentation further includes a second inverting voltage amplifier, having an input and an output, the input connected to the input of the second augmentation circuit and the output connected to the output of the second augmentation circuit.

3. An augmented lossless feedback double-balanced active mixer circuit, as claimed in claim 1, wherein the first augmentation circuit further includes a first common-emitter transistor amplifier, having an input and an output, the connected to the input of the first augmentation circuit, and the output connected to the output of the first augmentation circuit, and the second augmentation circuit further includes a second common-emitter transistor amplifier, having an input and an output, the connected to the input of the second augmentation circuit, and the output connected to the output of the second augmentation circuit.

4. An augmented lossless feedback double-balanced active mixer circuit, as claimed in claim 1, wherein the first augmentation circuit further includes a first inverting positive feedback amplifier, having an input and an output, the input connected to the input of the first augmentation circuit and the output connected to the output of the first augmentation circuit, and the second augmentation circuit further includes a second inverting positive feedback amplifier, having an input and an output, the input connected to the input of the second augmentation circuit and the connected to the output of the second augmentation circuit.

5. An augmented lossless feedback balanced active mixer circuit, as claimed in claim 1, wherein the first augmentation circuit further includes a first transformer having a primary winding and a secondary winding, the primary winding connected from the input terminal of the first augmentation circuit to a signal ground and the secondary winding connected from the output of the first augmentation circuit to a signal ground in reverse phase relative to the primary winding, and the second augmentation circuit further includes a second transformer having a primary winding and a secondary winding, the primary winding connected from the input terminal of the second augmentation circuit to a signal ground and the secondary winding connected from the output of the second augmentation circuit to a signal ground in reverse phase relative to the primary winding.

6. A method of combining an input intermediate frequency (IF) signal and an input local oscillator (LO) signal and providing a linearized output radio frequency (RF) signal comprising the steps of:

providing differential first and second IF input signals;

providing differential LO input signals;

combining the first IF input signal and the differential LO input signals, producing differential first and second RF signals;

combining the second IF input signal and the differential LO input signals, producing differential third and fourth RF signals;

combining the first, second, third, and fourth RF signals and producing first and second feedback signals;

combining the first, second, third, and fourth RF signals and producing an RF output signal;

combining the first feedback signal with the first IF input signal in a lossless network, providing a noise-free correction for linearizing the first and second differential RF signals;

combining the second feedback signal with the second IF input signal in a lossless network, providing a noise-free correction for linearizing the third and fourth differential RF signals;

detecting a first error signal;

conditioning the first error signal;

applying the conditioned first error signal to provide a correction for reducing the first error signal;

detecting a second error signal;

conditioning the second error signal; and applying the conditioned second error signal to provide a correction for reducing the second error signal.

\* \* \* \* \*